United States Patent
Matsushima et al.

(10) Patent No.: US 7,146,194 B2
(45) Date of Patent: Dec. 5, 2006

(54) AMPLIFYING CIRCUIT, SPEAKER SYSTEM, AND MOBILE INFORMATION TERMINAL EMPLOYING AMPLIFYING CIRCUIT

(75) Inventors: Makoto Matsushima, Hyogo-Ken (JP); Katsuhiko Manabe, Hyogo-Ken (JP)

(73) Assignee: Ricoh Company, Ltd., Tokyo (JP)

( * ) Notice: Subject to any disclaimer, the term of this patent is extended or adjusted under 35 U.S.C. 154(b) by 419 days.

(21) Appl. No.: 10/673,473

(22) Filed: Sep. 30, 2003

(65) Prior Publication Data
US 2004/0116162 A1 Jun. 17, 2004

(30) Foreign Application Priority Data
Sep. 30, 2002 (JP) ............................. 2002-286283

(51) Int. Cl.
*H04B 1/38* (2006.01)
(52) U.S. Cl. ..................... 455/572; 381/120; 330/297
(58) Field of Classification Search ............... 455/574, 455/572, 341; 381/120; 330/297
See application file for complete search history.

(56) References Cited

U.S. PATENT DOCUMENTS

| | | | |
|---|---|---|---|
| 6,643,527 B1 * | 11/2003 | Satoh et al. | 455/574 |
| 6,696,877 B1 * | 2/2004 | Maejima et al. | 327/333 |
| 6,757,526 B1 * | 6/2004 | Sharp et al. | 455/127.1 |
| 6,801,894 B1 * | 10/2004 | Nakamura et al. | 704/258 |
| 6,954,537 B1 * | 10/2005 | Ng et al. | 381/94.5 |

* cited by examiner

*Primary Examiner*—Nguyen T. Vo
*Assistant Examiner*—Adeel Haroon
(74) *Attorney, Agent, or Firm*—Dickstein Shapiro LLP

(57) ABSTRACT

An amplifying circuit includes a battery power source, a regulator that regulates an output of the battery power source and generates a reference voltage, and a signal ground generating device that generates and outputs a signal ground by changing the reference voltage in accordance with deterioration detected from the battery power source. An operational amplifier is provided to amplify and output a signal having prescribed waveform to be input to a speaker. The operational amplifier uses a battery power source as a driving power source of its own. The signal ground is positioned at a center of vibration amplitude of the waveform.

6 Claims, 7 Drawing Sheets

AMPLIFYING CIRCUIT, SPEAKER SYSTEM, AND MOBILE INFORMATION TERMINAL EMPLOYING AMPLIFYING CIRCUIT

This application claims priority under 35 USC §119 to Japanese Patent Application No. 2002-286283, filed on Sep. 30, 2002, the contents of which are incorporated by reference in its entirety herein.

The present invention relates to a mobile information terminal, such as a cellular phone, a computerized personal organizer, a handset, a voice recognition device, a voice memory device, a computer etc., and particularly to a mobile information terminal including a speaker system having an amplifying circuit driven by a battery.

BACKGROUND OF THE INVENTION

A conventional speaker system 200 having a circuit utilized in a mobile information terminal, such as a cellular phone, computerized personal organizer, handset, voice recognition device, voice memory device, computer, etc., each driven by a battery is shown in FIG. 6. A conventional speaker system 200 is expected to always generate a high and stable output, even when a battery power supply receives noise, the output level of the battery decreases due to deterioration with age, and when electric energy varies throughout such a device.

In conventional speaker system 200, an analog music signal Sin is output from an audio digital analog converter (audio DAC 1), and is input to a positive signal input terminal of an operational amplifier 2, that performs non-inverted amplification via a condenser C and a resistance r1. A signal ground SG is also input to the positive signal input terminal via a resistance r2. A prescribed regulator (not shown) generates signal ground SG. During amplification by the operational amplifier 2, a value of the signal ground SG defines a center amplitude of vibration of the analog music signal Sin. The signal ground SG can be set to be half the driving voltage.

For example, a half-voltage of a battery power source VBAT can be set as the signal ground SG using a resistance division circuit. However, the signal ground SG fluctuates in such a situation due to change in an output of the battery power supply VBAT. The change in the output is typically caused by noise, and changes in consumption of power in the device. As a result, a signal output from the operational amplifier 2 is unstable.

Further, the signal ground SG is simultaneously input to positive signal input terminals of operational amplifiers 3, 4, and 5.

A non-inverted amplification signal output by the operational amplifier 2 is input to a negative input terminal of operational amplifier 3, forming an inverted amplifier together with resistance r4 via resistance r3. The non-inverted amplification signal is simultaneously input to a negative input terminal of operational amplifier 5, forming a non-inverted amplifier together with resistance r8, via resistance r7. An inverted amplification signal output from operational amplifier 3 is input to a negative input terminal of operational amplifier 4 that performs inversion amplification via a resistance r5.

The battery power supply VBAT outputs a voltage of approximately 4.2V when fully charged. Thus, a constant voltage Vcc of approximately 3.0 volts is obtained by stepping down the above-mentioned power supply voltage VBAT using regulator 7, and is supplied as a driving voltage to operational amplifiers 2 and 3. The battery power supply VBAT is supplied as driving voltages to operational amplifiers 4 and 5, bypassing the regulator 7 in order to enhance an output of the speaker 6.

The speaker 6 sounds in accordance with signals output from the operational amplifiers 4 and 5, with their phases being deviated from each other by 180° as shown in FIGS. 1 and 6. Since the signal ground SG input to the positive signal input terminals of the operational amplifiers 4 and 5 is typically constant in speaker system 200, a sound output from the speaker 6 deforms along with deterioration of age of the battery power supply VBAT. Specifically, when a full charge voltage of the battery power supply VBAT is 4.2 volts, and the signal ground SG is 2.1 volts, the analog music signal Sin vibrates at the center of the signal ground SG as shown in FIG. 7A. However, when the battery power supply VBAT decreases down to 3.2 volts and the signal ground SG maintains 2.1 volts, the waveform of the analog music signal Sin is cut off at a portion of a positive phase higher than 3.2 volts and is deformed as shown in FIG. 7B.

Accordingly, the signal ground SG can be initially set to 1.6 volts in order to avoid the waveform from deforming as shown in FIG. 7C. However, when the battery power supply VBAT does not deteriorate at all, the negative phase is partially cut off and becomes deformed as shown in FIG. 7D. When such deformed waveforms of FIGS. 7B and 7D are utilized, the speaker decreases acoustically.

BRIEF SUMMARY OF THE INVENTION

Accordingly, an exemplary embodiment of the present invention includes an amplifying circuit having a battery power source, a regulator for regulating an output of the battery power source and generating a reference voltage, and a signal ground generating device for generating and outputting a signal ground by changing the reference voltage in accordance with deterioration of the battery power source. At least one operational amplifier is provided to amplify and output a signal having a prescribed waveform. The operational amplifier uses the battery power source as a driving power source. The signal ground is positioned at a center of a vibration amplitude of the waveform during amplification by the operational amplifier.

In another exemplary embodiment, the signal ground generating device further includes a control section for outputting a control signal when the battery power supply deteriorates to a prescribed level, and a resistance division circuit is provided for dividing the reference voltage at a prescribed rate to obtain a prescribed level of a signal ground in accordance with the control signal.

In yet another exemplary embodiment, the control section includes a RAM memory for storing data related to a prescribed deterioration level of the battery power supply, and a CPU for controlling the control section to output the control signal when the battery power supply deteriorates into the prescribed level.

In yet another exemplary embodiment, the control section includes a plurality of comparators, each of which compares a voltage of the batter power supply with a unique reference voltage. The plurality of the same number of division resistances to the comparators is serially connected. Each of the plurality of resistances is turned on or off in accordance with a comparison result of the plurality of comparators.

BRIEF DESCRIPTION OF THE DRAWINGS

The present disclosure and features and advantages thereof will be more readily apparent from the following detailed description and appended claims when taken with drawings, wherein:

DETAILED DESCRIPTION OF THE INVENTION

Figure 1:
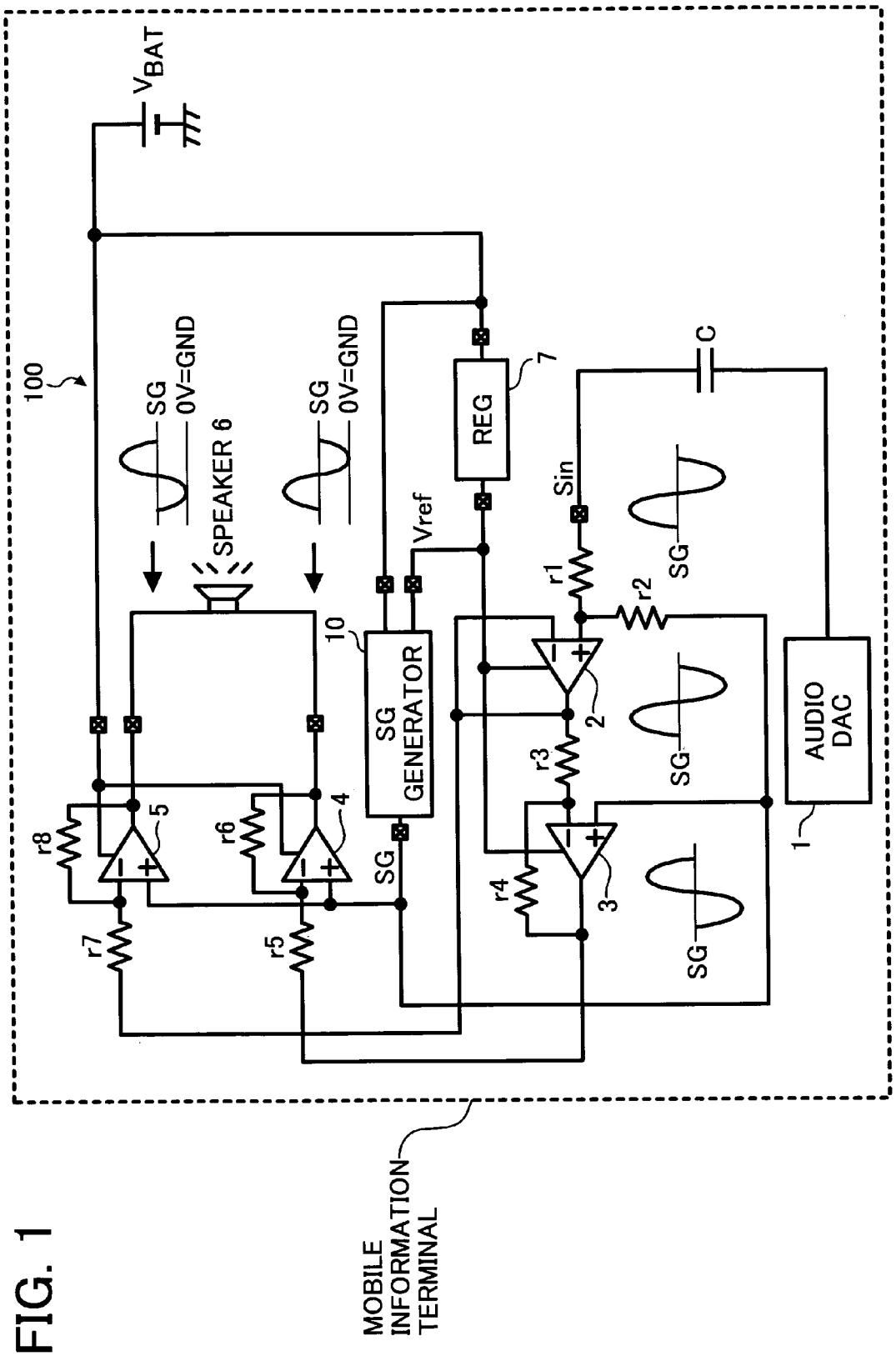
FIG. 1 illustrates a circuit of a speaker system employing an operational amplifier according to a first exemplary embodiment.

Referring now to the drawings, wherein like reference numerals and marks designate identical or corresponding parts throughout several views, FIG. 1 illustrates a speaker system 100, employed in a mobile information terminal that includes a plurality of operational amplifiers 4 and 5 under a first embodiment. As shown, a signal ground SG output from an SG generator 10 is input to respective positive input terminals of operational amplifiers 2, 3, 4, and 5 via resistance r2. As will be discussed in greater detail below, the SG generator 10 changes a value of the signal ground in accordance with a deterioration of a battery power source VBAT.

The battery power source VBAT outputs approximately 4.2 volts when fully charged. A constant voltage "Vcc" of approximately 3.0 volts is obtained by stepping down the value of the battery power source VBAT using a regulator 7, and is supplied as driving voltages to the operational amplifiers 2 and 3. Also supplied as driving voltages to the operational amplifiers 4 and 5 is the battery power supply VBAT in order to bring the speaker 6 to a maximum level.

An analog music signal Sin is output from an audio digital to analog converter (DAC) 1 and is input to a positive input terminal of operational amplifier 2, that performs non-inversion amplification, via a resistance r1. An amplitude of vibration of the analog music signal Sin is preferably set to be less than twice a difference between the driving voltage Vcc and the signal ground SG. A non-inverted amplification signal output by operational amplifier 2 is input to a negative input terminal of operational amplifier 3, forming an inversion amplifier together with resistance r4, via resistance r3. The non-inverted amplification signal is simultaneously input to a negative input terminal of operational amplifier 5, forming an inversion amplifier together with resistance r8, via resistance r7. An output of the operational amplifier 3 is input to a negative input terminal of the operational amplifier 4, performing inversion amplification together with resistance r6, via resistance r5. The speaker 6 sounds in accordance with signals output from the operational amplifiers 4 and 5 with their phases being inverted from each other as shown in FIG. 1.

The SG generator 10 is now described in more detail with reference to FIG. 2. The SG generator 10 includes an SG switching section 17 that switches a signal ground SG between two levels by turning ON/OFF switch SW1 and thereby changing a resistance division ratio. Also included is a control section 13 that outputs a control signal enabling the switch SW1 to turn ON/OFF in accordance with a digital value converted from a value (Dout) of the battery power supply VBAT using an A/D converter 12.

Figure 2:
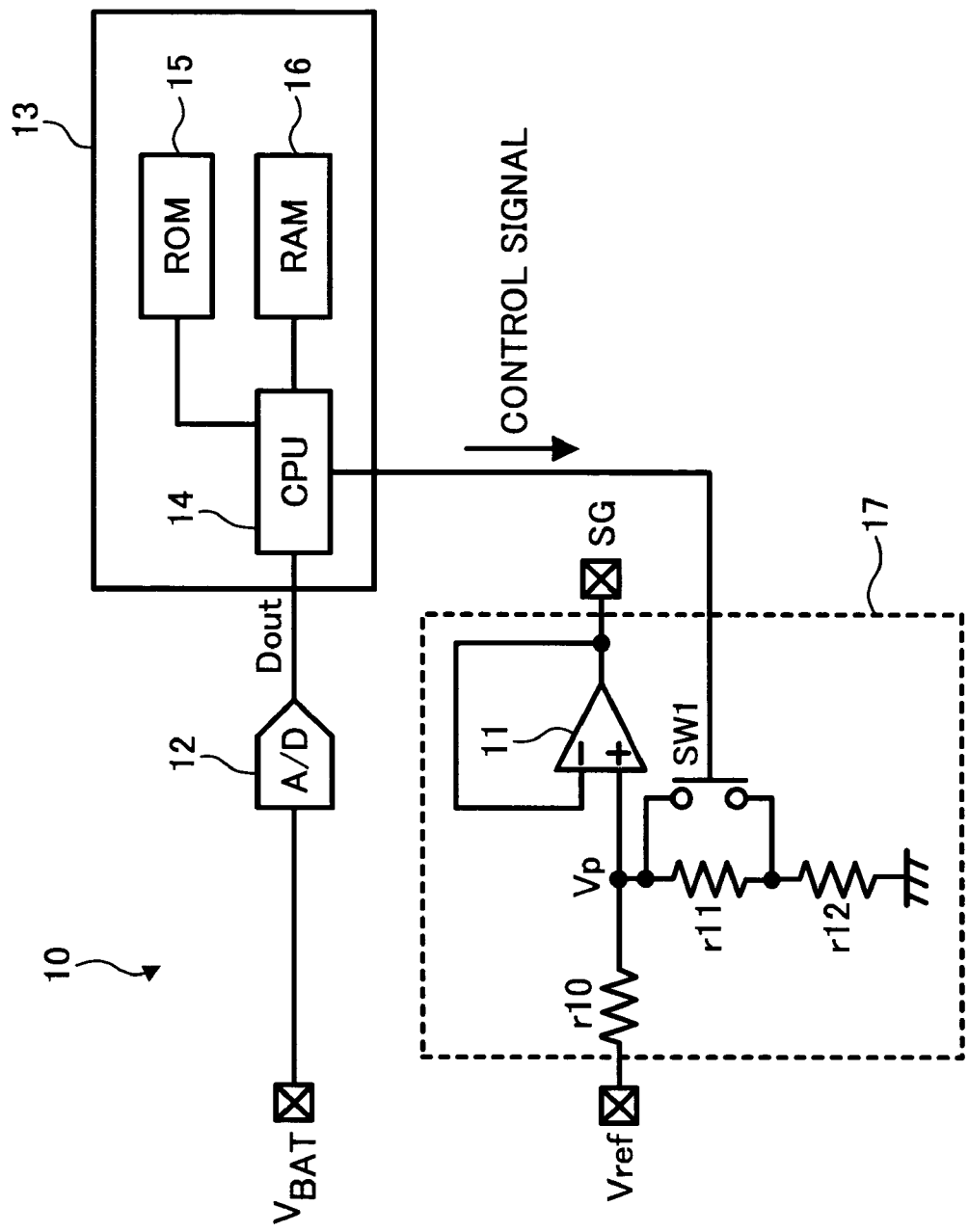
FIG. 2 illustrates a configuration of an exemplary SG generator.

As shown in FIG. 2, the control section 13 includes a CPU 14, a ROM memory 15, for storing various control programs, and a RAM memory 16 used when the program is executed.

The SG switching section 17 outputs a signal ground SG1 via operational amplifier 11 as an SG when the switch SW1 is turned ON. Specifically, the SG1 is obtained by multiplying Vref by a resistance division ratio (r12/(r10+r12)) using resisters r10 and r12. Also, when the switch SW1 is turned OFF, the SG switching section 17 obtains and outputs SG2 by multiplying the signal ground "Vref" by a resistance division ratio (r11+r12)/(r10+r11+r12) as an SG via operational amplifier 11 using resisters r10, r11, and r12.

Respective values of the resistances r10, r11, and r12 are determined so that the SG1 an SG2 can be approximately 2.0 volts and 1.8 volts, respectively.

Figure 3:
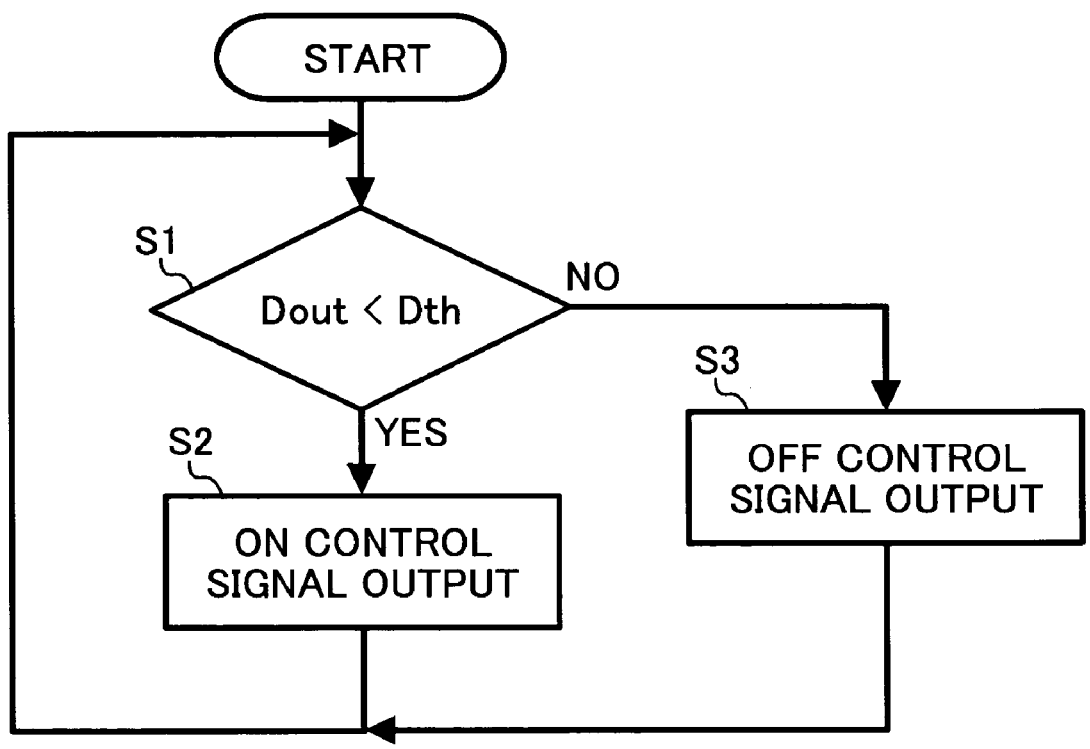
FIG. 3 illustrates an exemplary process executed by a CPU included in a control section.

A process controlled by the CPU 14 is now described with reference to FIG. 3. When a digital output Dout generated by A/D converter 12 does not reach a threshold DTH, for example, 3.9 volts (identified as a "yes" response in step S1), it is determined that an output of the battery power supply has decreased, and a control signal is triggered high to enable switch SW1 to turn ON (step S2). When the digital output Dout is higher or equal to the threshold DTH (identified as "no", in step S1), it is determined that the output of the battery power supply is sufficient, and a control signal of a Low level is transmitted to turn switch SW1 OFF (step S3).

Referring back to FIG. 2, the control section 13 can employ a comparator for comparing a reference signal DTH with a digital signal rather than the above-mentioned software control device.

A speaker system 150 of a second exemplary embodiment is now described with reference to FIG. 4. The speaker system 150 is similar to the speaker system 100 of FIG. 1. Specifically, the speaker system 150 also employs an SG generator 20 instead of the SG generator 10 of FIG. 1. Since structural elements other than the SG generator 20 are substantially the same to those of the speaker system 100, the entire configuration of the speaker system 150 is not repeated for the sake of brevity.

Figure 4:
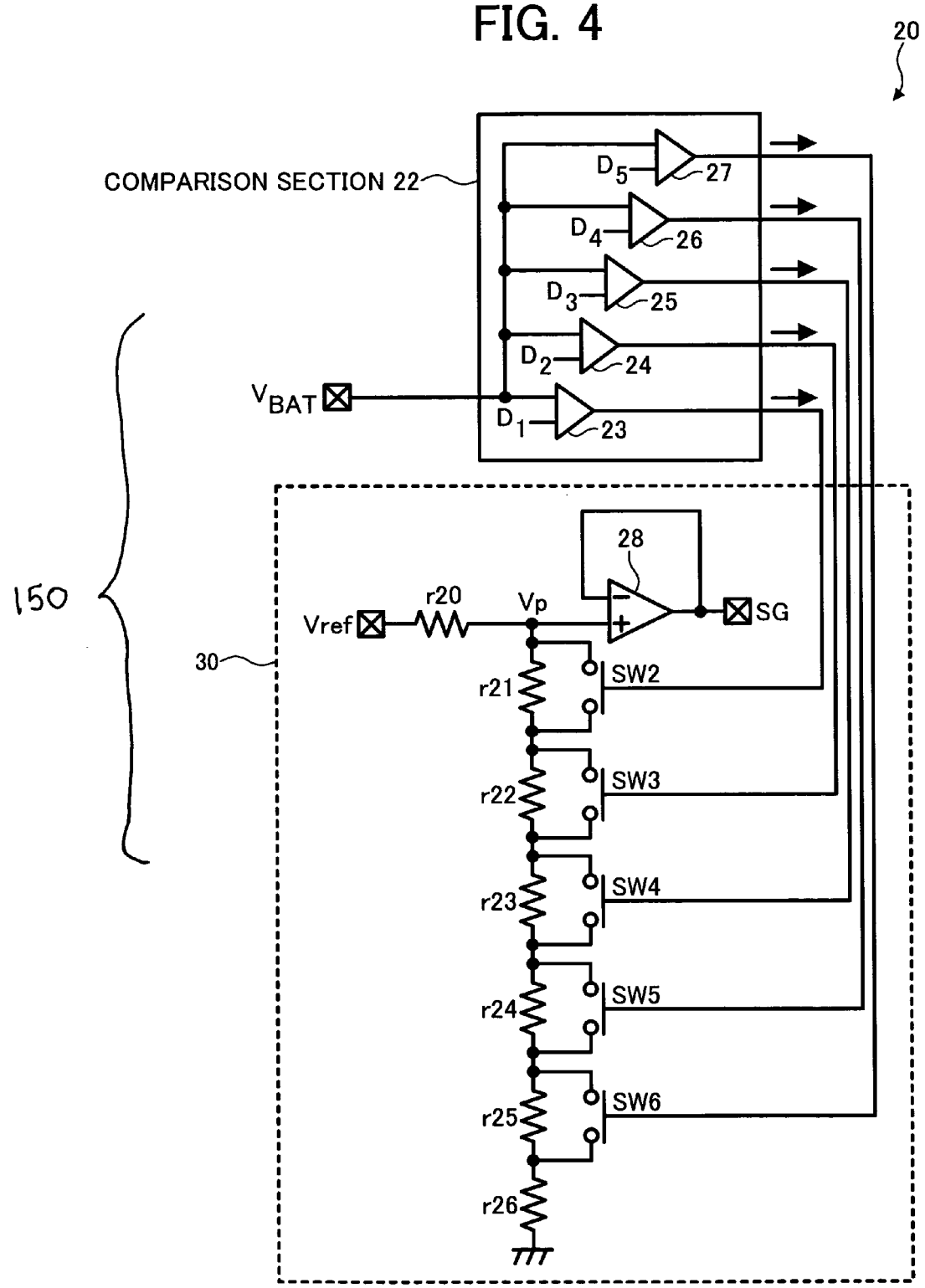
FIG. 4 illustrates a configuration of a SG generator utilizing a plurality of operational amplifiers according to a second exemplary embodiment.

As shown in FIG. 4, the SG generator 20 changes a value of the signal ground into six levels in accordance with deterioration of the battery power supply VBAT. In this respect, the SG generator 20 includes an SG switching section 30 that switches the signal ground SG between six levels by turning ON/OFF appropriate switches SW2 to SW6 and thereby changing a resistance division ratio. Also included is a comparison section 22 that outputs a control signal, enabling the switches SW2 to SW6 to turn ON/OFF in accordance with any deterioration of the battery power supply VBAT.

The comparison section 22 is preferably formed from five comparators 23 to 27, having different voltages D1 to D5, and decreasing in this order to be compared with the battery power supply VBAT in turn. For example, D1, D2, D3, and D4 can be 4.0 volts, 3.8 volts, 3.6 volts, 3.4 volts, and 3.2 volts, respectively. Thus, when the battery power supply VBAT is higher than or equal to 4.0 volts, control signals of Low levels enabling switches SW2 to SW6 to turn OFF are output from the respective comparators 23 to 27. Thus, a SG3 is calculated and obtained in accordance with the following formula:

$$SG3 = Vref \times \left(\frac{r21 + r22 + r23 + r24 + r25 + r26}{r20 + r21 + r22 + r23 + r24 + r25 + r26}\right)$$

Similarly, when the battery power supply VBAT becomes lower than 4.0 volts and higher than or equal to 3.8 volts, a control signal of a High level enabling the switch SW2 to turn ON is output from comparator 23, and control signals of Low levels enabling the switches SW3 to SW6 to turn OFF are output from comparators 24 to 27. Thus, a SG4 is calculated and obtained in accordance with the following formula:

$$SG4 = Vref \times \left(\frac{r22 + r23 + r24 + r25 + r26}{r20 + r22 + r23 + r24 + r25 + r26}\right)$$

When the battery power supply VBAT becomes higher than or equal to 3.6 volts and lower than 3.8 volts, control signals of High levels enabling the switches SW2 and SW3 to turn ON are output from comparators 23 and 24. Simultaneously, control signals of Low levels enabling the switches SW4 to SW6 to turn OFF are output from comparators 25 to 27. Thus, an SG5 is calculated and obtained in accordance with the following formula:

$$SG5 = Vref \times \left(\frac{r23 + r24 + r25 + r26}{r20 + r23 + r24 + r25 + r26}\right)$$

When the battery power supply VBAT becomes higher than or equal to 3.4 volts and lower than 3.6 volts, control signals of High levels enabling switches SW2, SW3, and SW4 to turn ON are output from comparators 23, 24, and 25, respectively. Simultaneously, control signals of Low levels enabling switches SW5 to SW6 to turn OFF are output from comparators 26 and 27, respectively. Thus, the SG is calculated and obtained in accordance with the following formula as an SG6:

$$SG6 = Vref \times \left(\frac{r24 + r25 + r26}{r20 + r24 + r25 + r26}\right)$$

When the battery power supply VBAT becomes higher than or equal to 3.2 volts and lower than 3.4 volts, control signals of High levels enabling switches SW2, SW3, SW4, and SW5 to turn ON are output from comparators 23, 24, 25, and 26, respectively. Simultaneously, a control signal of a Low level enabling the switch SW6 to turn OFF is output from the comparator 27. Thus, an SG7 is calculated and obtained in accordance with the following formula:

$$SG7 = Vref \times \left(\frac{r25 + r26}{r20 + r25 + r26}\right)$$

Finally, when the battery power supply VBAT is lower than 3.2 volts, control signals of High levels enabling switches SW2 to SW6 to turn ON are output from comparators 23 to 27, respectively. Thus, an SG8 is calculated and obtained in accordance with the following formula:

$$SG8 = Vref \times \left(\frac{r21 + r26}{r20 + r26}\right)$$

In the above-mentioned embodiments, the resistances r20 to r27 employ prescribed values so that the SG3 to SG8 can be 2.1, 2.0, 1.9, 1.8, 1.7, and 1.6 volts, respectively.

Figure 5B:
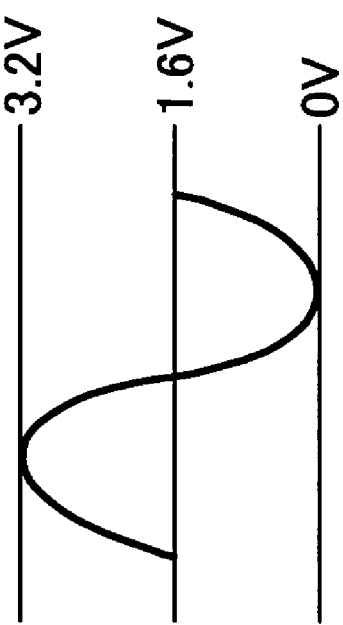
FIGS. 5A and 5B illustrate exemplary waveforms of signals output by the operational amplifiers according to the second embodiment.
Figure 5A:
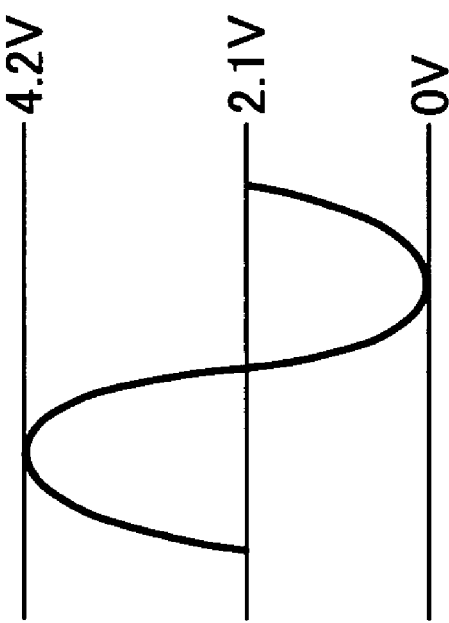
Figure 6:
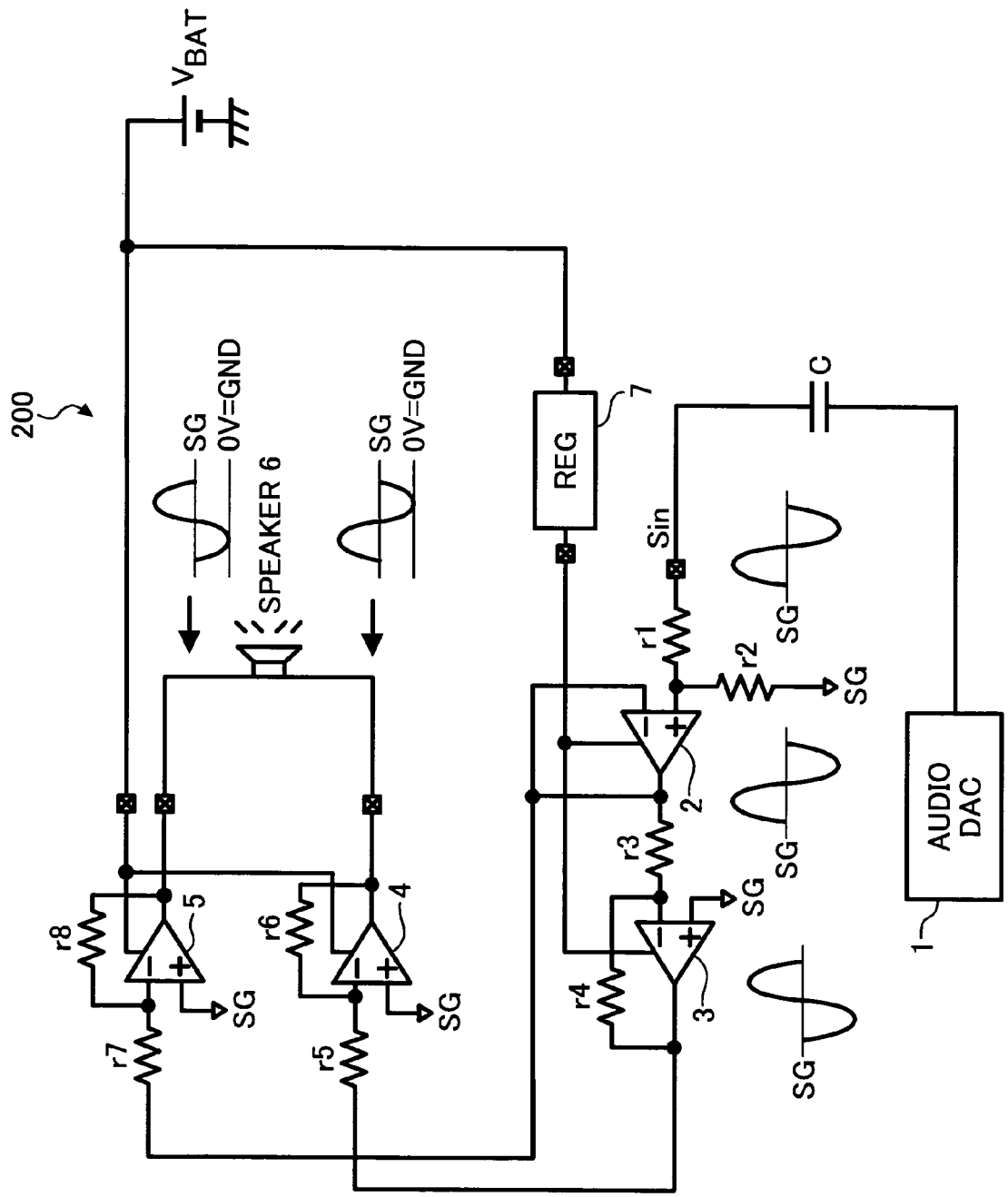
FIG. 6 illustrates a circuit of a speaker system employing a conventional operational amplifier.
Figure 7A:
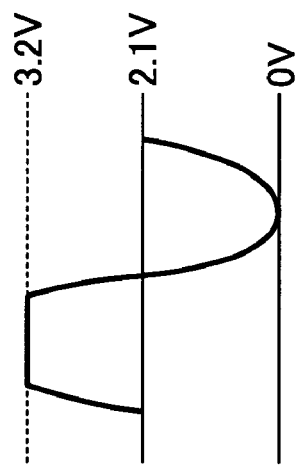
FIGS. 7A to 7D collectively illustrate deformation of waveforms appearing on signals output from the conventional operational amplifiers.
Figure 7B:
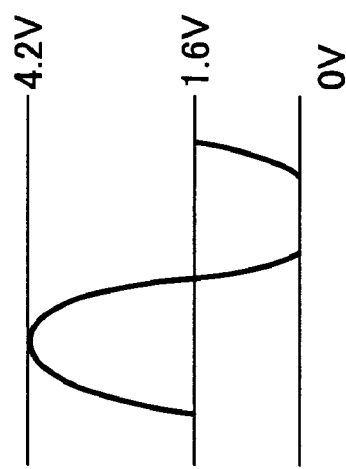
Figure 7C:
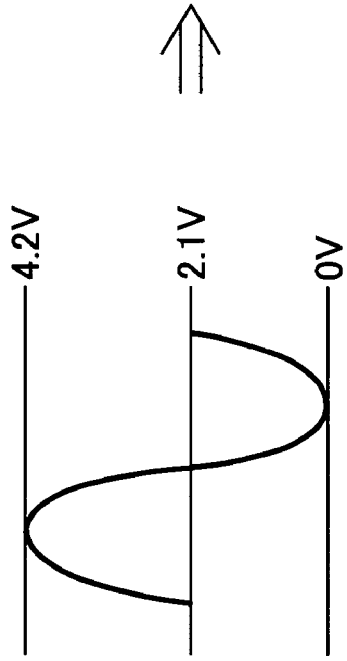
Figure 7D:
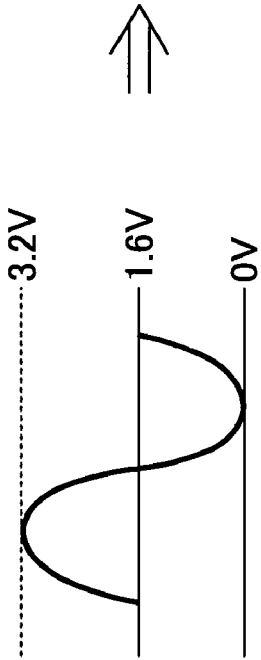

Accordingly, a signal ground SG can be gradually decreased along with the deterioration of a battery power supply VBAT. As a result, when the battery power supply VBAT is 4.2 volts, the signal ground SG is set to 2.1 volts as illustrated in FIG. 5A. When the battery power supply VBAT decreases down to 3.2 volts, the signal ground SG can be decreased down to 1.6 volts, as illustrated in FIG. 5B. Thus, deformation of upper and lower side waves of an analog music signal, which appears either when the battery power supply VBAT decreases from 4.2 to 3.2 volts while the signal ground value is fixed to 2.1 volts, or when a battery is in use while setting the signal ground to be low, such as 1.6 volt, in preparation for its descending, can be prevented. As a result, deformation of the analog music signal due to deterioration of the battery power supply VBAT can efficiently be suppressed or prevented.

Further, a value of a battery power supply VBAT can be digitalized by an A/D converter, and control signals input to respective switches SW2 to SW6 can be output by software control instead of using the comparator 22 similar to the control section 13 of the first embodiment.

The mechanisms and processes set forth in the present invention may be implemented using one or more conventional general-purpose microprocessors and/or signal processors programmed according to the teachings in the present specification as will be appreciated by those skilled in the relevant arts. Appropriate software coding can readily be prepared by skilled programmers based on the teachings of the present disclosure, as will also be apparent to those skilled in the relevant arts. However, as will be readily apparent to those skilled in the art, the present invention also may be implemented by the preparation of application-specific integrated circuits by interconnecting an appropriate network of conventional component circuits or by a combination thereof with one or more conventional general purpose microprocessors and/or signal processors programmed accordingly. The present invention thus also includes a computer-based product which may be hosted on a storage medium and include, but is not limited to, any type of disk including floppy disks, optical disks, CD-ROMs, magnet-optical disks, ROMs, RAMs, EPROMs, EEPROMs, flash memory, magnetic or optical cards, or any type of media suitable for storing electronic instructions.

Numerous additional modifications and variations of the present invention are possible in light of the above teachings. It is therefore to be understood that within the scope of the appended claims, the present invention may be practiced otherwise than as specifically described herein.

What is claimed as new and desired to be protected by Letters Patent of the United States is:

1. An amplifying circuit, comprising:
    a battery power source;
    a regulator, configured to regulate an output of the battery power source and to generate a reference voltage;
    a signal ground generating device configured to generate and output a signal ground by applying the reference voltage to a resistance changed in accordance with deterioration of the battery power source; and
    at least one operational amplifier configured to amplify and output a signal having a prescribed waveform, said operational amplifier using the battery power source as a driving power source, wherein the signal ground is positioned at a center of a vibration amplitude of the waveform.

2. The amplifying circuit as claimed in claim 1, wherein said signal ground generating device further comprises:
    a control section, configured to output a control signal when
    the battery power source deteriorates to a prescribed level; and
    a resistance division circuit, configured to divide the reference voltage at a prescribed rate to obtain a prescribed signal ground in accordance with the control signal.

3. The amplifying circuit as claimed in claim 2, wherein said control section includes a CPU and a RAM, wherein said RAM stores data of a prescribed deterioration level of the battery power source, and said CPU controls the control section to output the control signal when the battery power source deteriorates to the prescribed deterioration level.

4. The amplifying circuit as claimed in claim 2, wherein said control section includes a plurality of comparators, each configured to compare a voltage of the battery power source with a unique reference voltage; and wherein said resistance division circuit includes a plurality of division resistances being serially connected and having the same number of resistances as a number of the comparators, each of said plurality of resistances being turned on or off in accordance with a comparison result of the plurality of comparators.

5. The amplifying circuit as claimed in claim 1, wherein a speaker is driven by the battery power source.

6. A mobile information terminal, comprising:
    a battery power source;
    a regulator, configured to regulate an output of the battery power source and to generate a reference voltage;
    a signal ground generating device configured to generate and output a signal ground by applying the reference voltage to a resistance changed in accordance with deterioration of the battery power source;
    at least one operational amplifier configured to amplify and output a signal having a prescribed waveform, said operational amplifier using the battery power source as a driving power source, wherein the signal ground is positioned at a center of a vibration amplitude of the waveform; and
    a speaker, driven by the battery power source.

* * * * *